United States Patent
Cheung et al.

(10) Patent No.: US 7,155,687 B2
(45) Date of Patent: Dec. 26, 2006

(54) METHODS AND APPARATUS FOR SCAN INSERTION

(75) Inventors: Hugo Cheung, Tucson, AZ (US); Herbet Braisz, Marana, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 139 days.

(21) Appl. No.: 10/838,969

(22) Filed: May 4, 2004

(65) Prior Publication Data

US 2005/0251763 A1 Nov. 10, 2005

(51) Int. Cl.
*G06F 17/50* (2006.01)
(52) U.S. Cl. .................. 716/3; 716/1; 716/2; 716/5; 716/10; 716/11; 716/18
(58) Field of Classification Search ............ 716/1, 716/2, 3, 5, 10, 11, 18
See application file for complete search history.

(56) References Cited

U.S. PATENT DOCUMENTS

| | | | |
|---|---|---|---|
| 5,285,153 A * | 2/1994 | Ahanin et al. | 324/73.1 |
| 6,389,566 B1 * | 5/2002 | Wagner et al. | 714/726 |
| 6,434,735 B1 * | 8/2002 | Watkins | 716/16 |
| 6,957,403 B1 * | 10/2005 | Wang et al. | 716/3 |
| 2005/0022083 A1 * | 1/2005 | Wagner et al. | 714/726 |

* cited by examiner

*Primary Examiner*—Vuthe Siek
(74) *Attorney, Agent, or Firm*—W. James Brady; Frederick J. Telecky, Jr.

(57) ABSTRACT

In accordance with the present electronic design automation (EDA) for integrated circuits invention prior to synthesis, dummy elements are added to the library and an internal scan clock pin with no connections is provided. Then the design is synthesized, scan insertion is performed (defining scan chains, inserting chains), and the scan clock is connected to all flip-flops SCLK pins. Finally, the dummy elements are replaced with real gates and clock tree insertion is performed after placing the cell in a layout.

5 Claims, 7 Drawing Sheets

METHODS AND APPARATUS FOR SCAN INSERTION

FIELD OF INVENTION

The present invention relates, generally, to clock circuits and, more particularly, to an improved method of implementing scan insertion in highly-gated clock circuits.

BACKGROUND OF THE INVENTION

Low-power electronic devices typically include exceedingly complex clock circuits that are designed to reduce power dissipation while providing critical timing information to the various subsystems. To help reduce power dissipation, such systems typically implement clock gating. Clock gating, however, presents layout problems during scan insertion and clock tree balancing. For example, typical electronic design automation (EDA) and synthesis software tools allow the designer to balance the clock trees in only a single mode, requiring multi-pass clock tree generation. If a designer balances the clock tree in normal operation mode, and then in scan mode, in most cases the normal mode will no longer function properly. Similarly, if the scan mode is balanced first, and then normal mode is balanced, the scan mode will no longer operate (e.g., the clock skew may be prohibitively high).

Currently known methods of addressing this problem involve manually balancing clock trees to meet the design requirements. This means that, even after a minor change to the design, where a different place-and-route is required, the manual process has to be repeated, and there is still uncertainty as to whether the design requirements can be met. The result is an iterative, manual process, which is particularly undesirable from a time-to-market perspective.

This manual process also gives rise to convergence problems, which also delay the design process. Furthermore, currently known solutions are designed for a single product, and therefore cannot be transferred to other products.

Methods are therefore needed to solve these and other deficiencies of the prior art. More particularly, there is a need for a scan insertion methodology that can run substantially automatically, is portable to future devices, and is convergent.

SUMMARY OF THE INVENTION

The present invention generally provides a convergent, predictable, and substantially automatic method of scan insertion in low power, highly-gated clock circuits, wherein a particular clock design is portable to different and future devices by simply adjusting the design hierarchy in the scripts, therefore reducing time-to-market.

In accordance with the present invention, a method of scan insertion in a clock circuit generally includes the steps of providing a system clock having a normal clock and a scan clock selectably coupled to the system clock; defining a scan chain associated with the normal clock; modifying a library element associated with the clock circuit; performing a synthesis and a scan insertion script; connecting the scan clock to the clock circuit; then undoing the step of modifying a library element.

The traditional method of scan insertion and balancing clocks involves first having a system clock, which can be used for scan mode and normal mode, then synthesizing the design, defining scan chain or scan chains, and inserting them in the design using a script. After that, the cells are placed in a layout and the clock trees are balanced. In accordance with the present invention, however, prior to synthesis, dummy elements are added to the library and an internal scan clock pin with no connections is provided. Then the design is synthesized, scan insertion is performed (defining scan chains, inserting chains), and the scan clock is connected to all flip-flops SCLK pins. Finally, the dummy elements are replaced with real gates and clock tree insertion is performed after placing the cell in a layout.

BRIEF DESCRIPTION OF THE DRAWINGS

The subject invention will hereinafter be described in conjunction with the appended drawing figures, wherein like numerals denote like elements, and.

DETAILED DESCRIPTION

The present invention generally provides a convergent, efficient, and substantially automatic method of scan insertion in low power, highly-gated clock circuits. As a preliminary matter, the following description relates to exemplary embodiments of the invention only, and is not intended to limit the scope, applicability or configuration of the invention in any way. Rather, the following description is intended to provide a convenient illustration for implementing various embodiments of the invention. As will become apparent, various changes may be made in the function and arrangement of the elements and process steps described in these embodiments without departing from the scope of the invention as set forth in the appended claims. For example, the described methods are often discussed in the context of particular software packages. The present invention, however, is not so limited, and may be used in the context of a variety of software packages of the type described.

Figure 1:
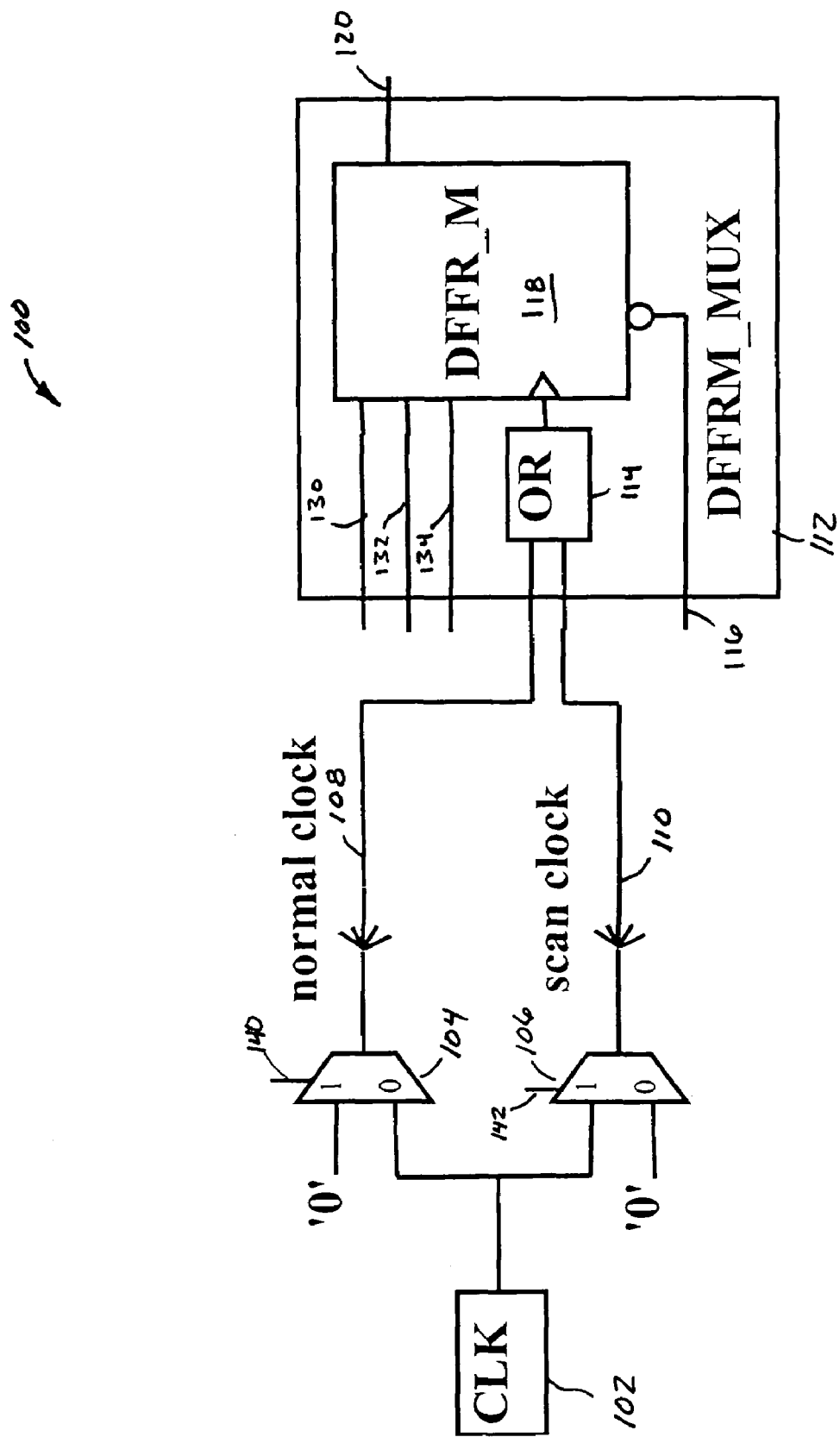
FIG. 1 is a schematic diagram of a clock circuit in accordance with the present invention.

In general, with momentary reference to FIG. 1, a method in accordance with an exemplary embodiment of the present invention is used to produce a clock circuit 100 including a clock signal CLK (102) and a pair of multiplexers 104 and 106 which are used to produce a "normal clock" signal 108 and a "scan clock" signal 110. Select lines 140 and 142 are provided on multiplexers 104 and 106, respectively. Signals 108 and 110 are input to OR gate 114, the output of which is the clock input to a flip flop 118. A reset signal 116, data inputs D0–D1 (130, 132), select input 134, and Q output 120 act to produce a scan flip-flop 112 having two separate clock lines, one for normal clock, and one for the scan clock. The function of OR gates, clocks, and flip flops are known in the art; therefore, in the interest of brevity, such components will not be described in detail herein. Furthermore, it will be appreciated that flip-flop 112 is a representation of just one flip-flop within the entire design, which might include thousands of flip-flops.

It will be appreciated that while it is common to use a single multiplexer to switch between scan and normal clocks, the present design uses two multiplexers (104 and 106) and an OR gate 114 in order to save chip area. This requires that one of the two clocks is switched off depending upon which mode the design is working. In an alternate embodiment, multiplexers 104 and 106 are replaced via an appropriately configured single multiplexer or other standard gate implementations.

The present methodology effectively overcomes the limitations provided by conventional synthesis and scan insertion methodologies. Referring to the schematic diagrams of FIGS. 1–6 in conjunction with the flowchart shown in FIG. 7, a description of an exemplary scan insertion process will now be provided.

Figure 2:
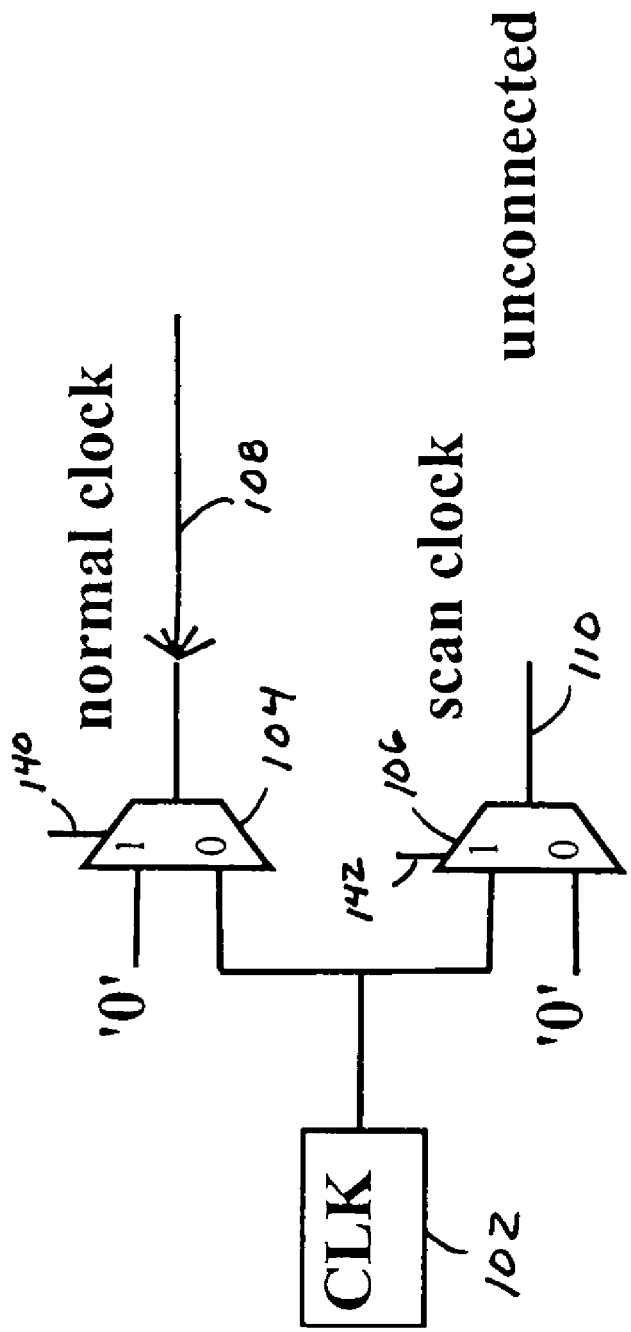
FIG. 2 depicts a method for separating a normal clock and a scan clock.

In step 702, the scan clock and normal clock are separated, producing two individual clock lines. That is, as shown in FIG. 2, scan clock signal 110 from multiplexer 106 is in an unconnected state, while normal clock signal 108 remains connected. The scan mode clock must be shut down during normal mode, and the normal mode clock must be shut down during scan mode to avoid overlapping clocks and glitches in the clock lines.

As mentioned above, EDA tools and most libraries do not support this type of methodology. That is, most libraries do not include flip-flops with both clock and scan clock inputs. As shown in FIG. 1, described above, the goal is then to produce a circuit (with balanced clocks) where each clock input of a scan flip-flop is connected to an OR gate 114. An OR gate is suitably used instead of a MUX gate in order to save chip area.

The present invention may be implemented in the context of any suitable synthesis environment. In one embodiment, for example, scan insertion is performed using a Synopsys software package, while clock tree generation is performed using a Cadence CTGen software package. It will be appreciated, however, that the present invention is not so limited.

In step 704, the appropriate library elements are modified. As shown conceptually in FIG. 3, individual library elements (such as DFFR_M flip flop 302) are replaced by modified, dummy placeholders (e.g., DFFRM_MUX flip flop 304). The DFFRM_MUX element 304 is initially added as an equivalent to DFFR_M 302 (with respect to both pin assignments and functionality). Eventually, as described below, the DFFRM_MUX elements are replaced with HDL equivalents.

Figure 3:
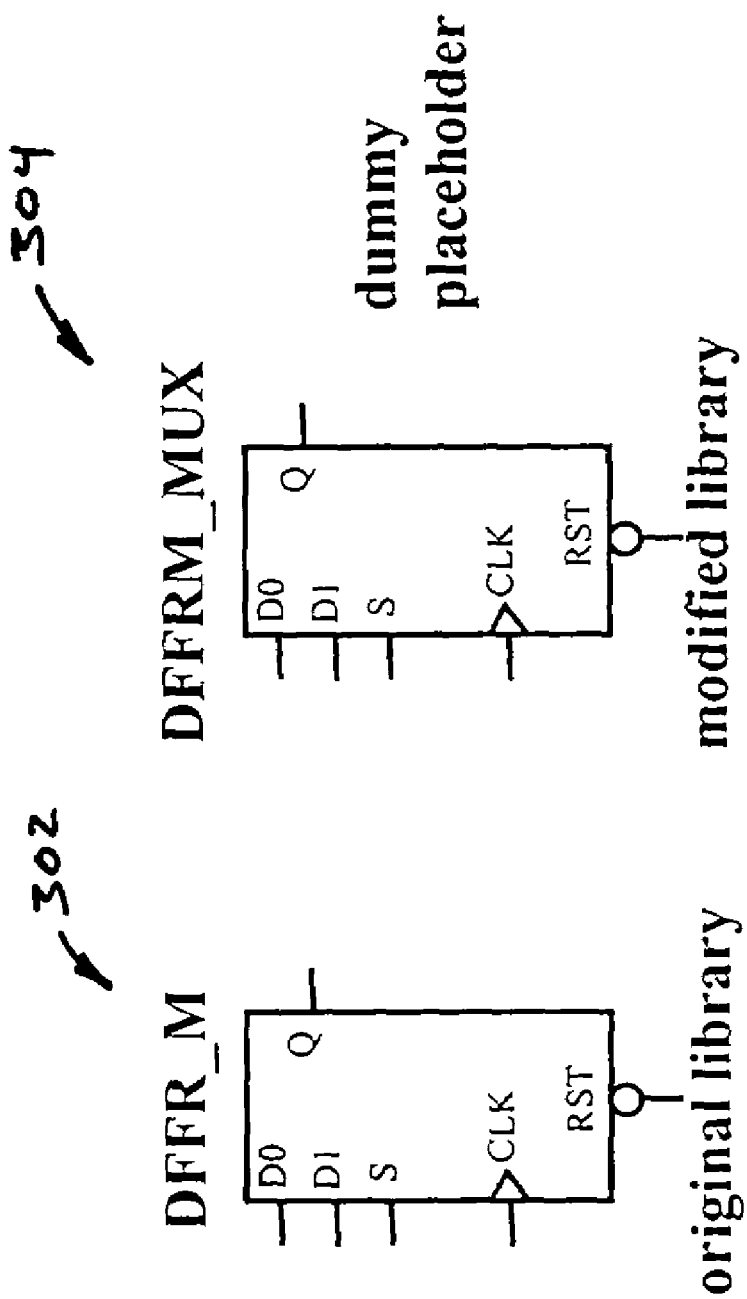
FIG. 3 is a schematic diagram showing an exemplary library modification.

It will be appreciated that the DFFR_M 302 shown in FIG. 3 is merely one example of a scan flip-flop from one special technology, and that the present invention comprehends any suitable flip-flop design. For example, libraries might typically include flip-flops having combinations such as set, set+reset, reset, and no set/no reset. These and other such modifications fall within the scope of this invention.

Next, in step 706, the whole design is synthesized using the modified library modified previously in step 704. This typically involves defining constraints, compiling, and replacing the standard flip-flops with their equivalent scan versions described above.

Figure 5:
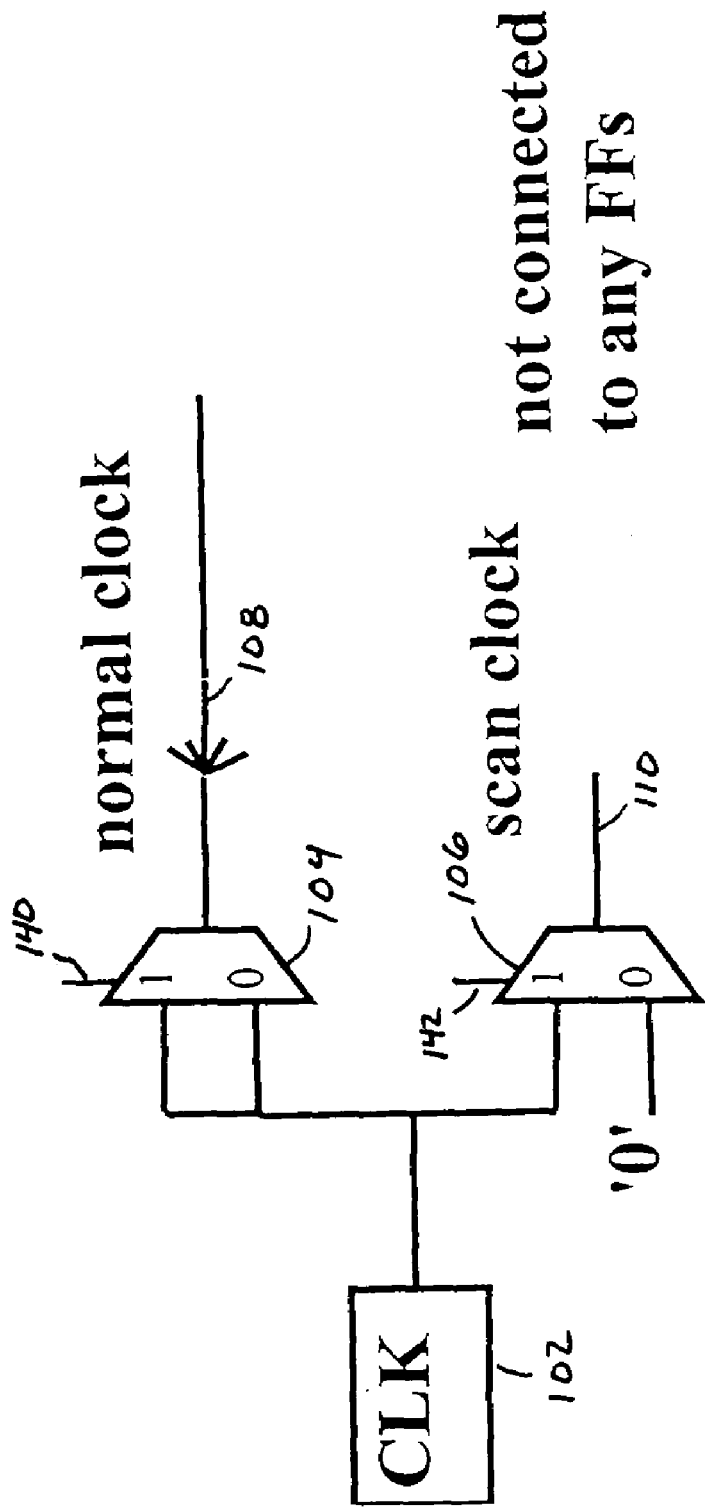
FIG. 5 is a schematic diagram of a clock circuit in accordance with one aspect of the present invention.

The CLK multiplexers are suitably manipulated (step 708). That is, as shown in FIG. 5, the scan clock is in an unconnected state, and CLK 102 is connected to both inputs of multiplexer 104. To clarify: during scan insertion, the EDA tool is switched to scan mode. In such a case, the normal clock is tied to '0' and all the flip-flop clock inputs are tied to '0'. Understandably, most EDA tools do not allow the designer to perform scan-insertion because the scan flip-flop receives a constant clock. Therefore, the method of the present invention temporarily connects CLK 102 to both inputs of 104. After scan-insertion and connecting the scan clock to all SCLK clock inputs, this modification is undone.

Scan chains are then defined and inserted (step 710). This is accomplished by defining and inserting the appropriate scan chain using the synthesis software. In accordance with Synopsys syntax, for example, this involves the "insert_scan" command.

Figure 4:
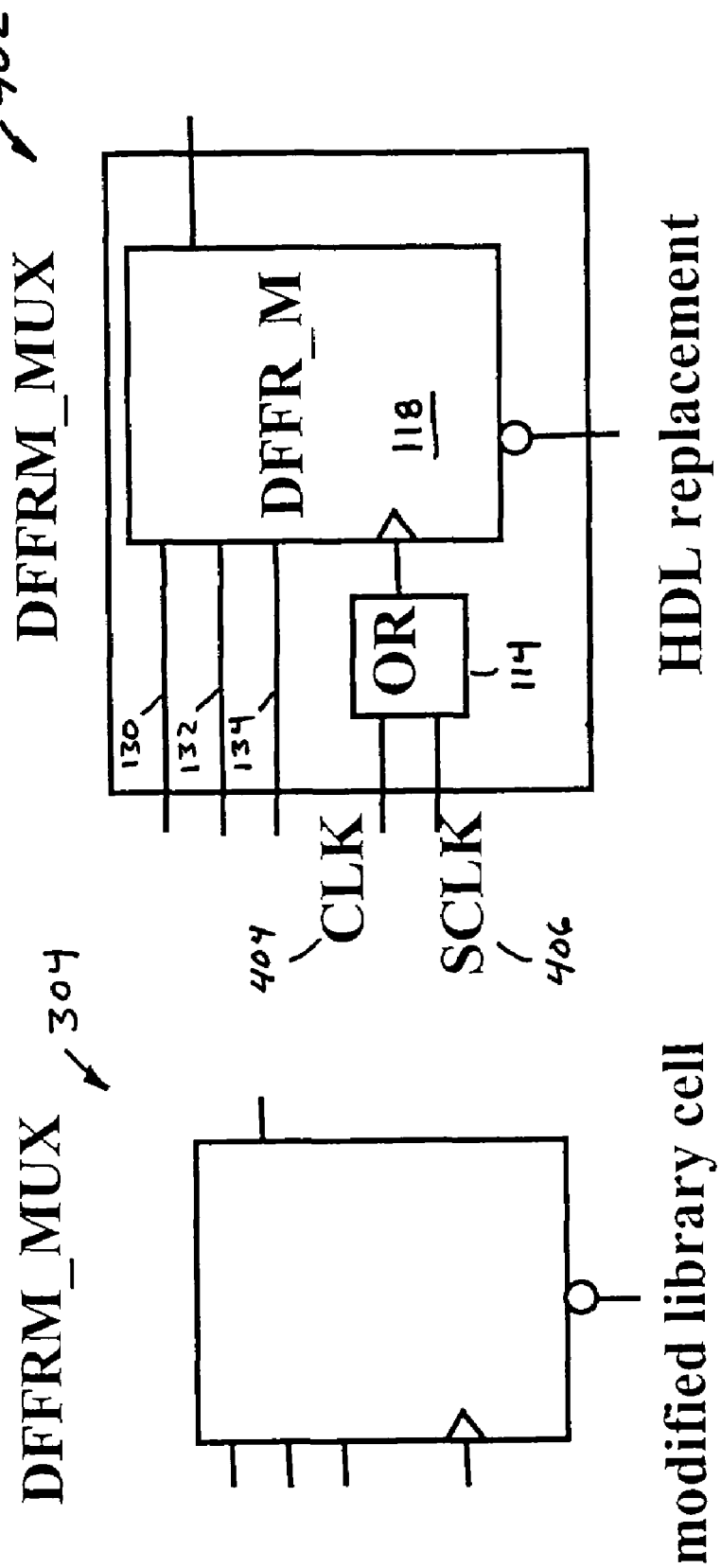
FIG. 4 is a schematic diagram showing HDL replacement of a modified library cell.

In step 712, dummy place-holders are replaced with HDL equivalents. Referring to FIG. 4, for example, the DFFRM_MUX modified library cell 304 is replaced with an HDL (hardware description language) equivalent 402. As shown, CLK signal 404 and SCLK signal 406 are inputs to OR gate 114, which itself leads to flip-flop 118—i.e., the DFFR_M from the original library that was modified in step 704. As shown, module 402 includes one more pin than 304 (i.e., SCLK 406). Typical tools do not allow a designer to add a SCLK at 304, as they do not understand a scan flip-flop with two clock inputs. Thus, the additional SCLK pin 406 is eventually connected, via a script, to the scan clock.

Figure 6:
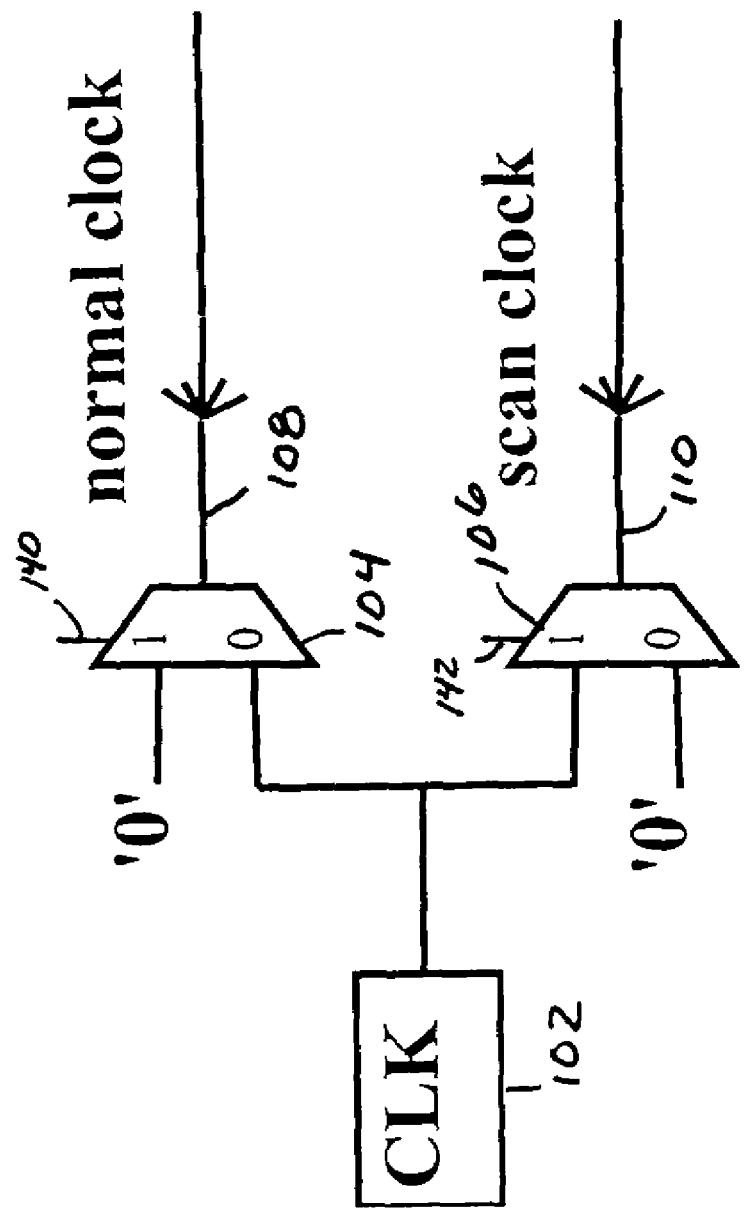
FIG. 6 is a schematic diagram of a clock circuit in accordance with another aspect of the present invention.
Figure 7:
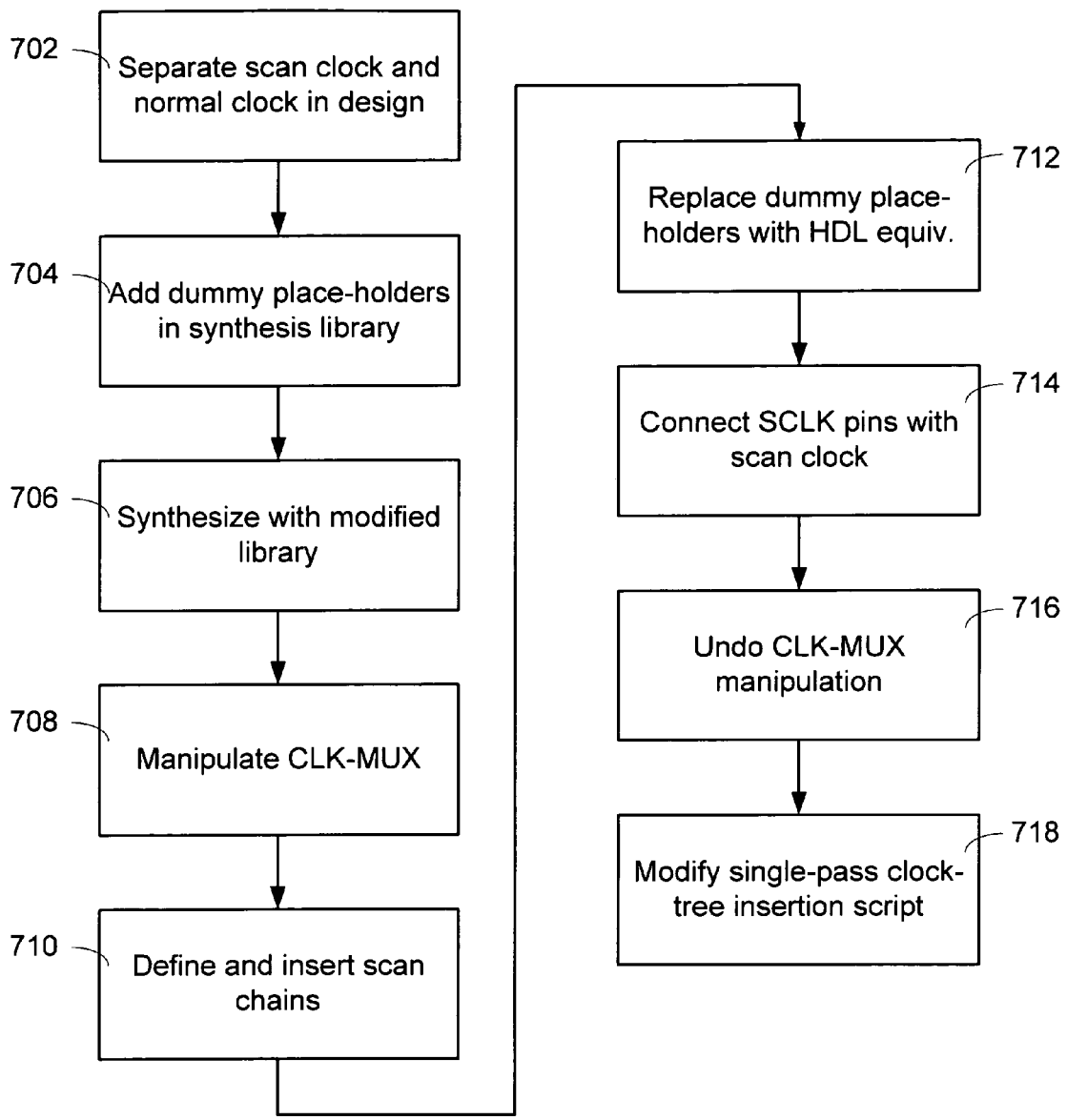
FIG. 7 is a flowchart showing an exemplary method in accordance with the present invention.

The scan clock is then connected to all SCLK pins (step 714). This is accomplished through the appropriate synthesis script. The previous CLK-MUX manipulation is then undone (step 716). That is, as shown in FIG. 6, scan clock 110 is connected to the clock circuit and the inputs of MUX 104 are changed back to the proper functionality.

To balance the clock trees, we only have to use a single pass script, which can be adapted easily to different future design structures (step 718). In this step, for example, the scan clock is added as a root clock. The final design structure then appears as shown in FIG. 1.

In general, what has been provided is a convergent, efficient, and substantially automatic method of scan insertion in low power, highly-gated clock circuits. This methodology is portable to different and future devices by simply adjusting the design hierarchy in the scripts, therefore reducing time-to-market. The development time for a particular product is predictable because the iteration type is fixed, and the method is convergent. Furthermore, this method may be used in simple libraries that do not include scan flip-flops with two clock pins.

Although the invention has been described herein in conjunction with the appended drawings, those skilled in the art will appreciate that the scope of the invention is not so limited. Modifications in the selection, design, and arrangement of the various components and steps discussed herein may be made without departing from the scope of the invention as set forth in the appended claims.

What is claimed is:

1. A method of clock scan insertion in a clock circuit, said method comprising the steps of:
providing a system clock;
providing a normal clock and a scan clock selectably coupled to said system clock;
defining a scan chain associated with said normal clock; disconnecting said scan clock;
modifying a library element associated with said clock circuit to generate a modified library element that includes a flip flop and an OR gate;
performing a synthesis and scan insertion script;
connecting said scan clock to said modified library element;
undoing said step of modifying said library element; and
placing a plurality of cells in a layout and performing a clock tree balancing for all clocks in said clock circuit.

2. The method of claim 1, wherein said library element includes a multiplexer.

3. The method of claim 2, wherein modified said library element includes an OR gate having as inputs said normal clock and said scan clock.

4. The method of claim 3, wherein said library element includes a flip-flop having a clock input coupled to the output of said OR gate.

5. The method of claim 4, wherein said flip-flop further includes at least one data input and at least one select input.

* * * * *

UNITED STATES PATENT AND TRADEMARK OFFICE
CERTIFICATE OF CORRECTION

PATENT NO.          : 7,155,687 B2                                    Page 1 of 1
APPLICATION NO.  : 10/838969
DATED                  : December 26, 2006
INVENTOR(S)          : Hugo Cheung and Herbert Braisz It is certified that error appears in the above-identified patent and that said Letters Patent is hereby corrected as shown below:

On the Title Page, Item (75) Inventors
Please delete "Herbet Braisz" and replace with --Herbert Braisz--.

Signed and Sealed this

Twelfth Day of May, 2009

JOHN DOLL
*Acting Director of the United States Patent and Trademark Office*